United States Patent
Shimizu et al.

(10) Patent No.: US 10,800,358 B2
(45) Date of Patent: Oct. 13, 2020

(54) ELECTROMAGNETIC SHIELD MEMBER, AND WIRE HARNESS

(71) Applicants: AUTONETWORKS TECHNOLOGIES, LTD., Yokkaichi-shi, Mie (JP); SUMITOMO WIRING SYSTEMS, LIMITED, Yokkaichi-shi, Mie (JP); SUMITOMO ELECTRIC INDUSTRIES, LTD., Osaka-shi, Osaka (JP)

(72) Inventors: Takeshi Shimizu, Yokkaichi (JP); Hirotaka Baba, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/492,040

(22) PCT Filed: Mar. 13, 2018

(86) PCT No.: PCT/JP2018/009667
§ 371 (c)(1),
(2) Date: Sep. 6, 2019

(87) PCT Pub. No.: WO2018/168831
PCT Pub. Date: Sep. 20, 2018

(65) Prior Publication Data
US 2020/0156566 A1    May 21, 2020

(30) Foreign Application Priority Data
Mar. 15, 2017  (JP) .................... 2017-050385

(51) Int. Cl.
*B60R 16/02* (2006.01)
*H01B 9/02* (2006.01)

(52) U.S. Cl.
CPC ......... *B60R 16/0215* (2013.01); *H01B 9/024* (2013.01)

(58) Field of Classification Search
CPC ...... B60R 16/0215; H01B 9/024; H01B 7/18; H05K 9/00; H01R 13/6592
(Continued)

(56) References Cited

U.S. PATENT DOCUMENTS 2,338,006 A * 12/1943 Morehouse ........... F16L 3/1233
                                                          248/74.3
9,133,963 B2 * 9/2015 Geppert ................ F16L 3/1233
(Continued)

FOREIGN PATENT DOCUMENTS

EP  2533253    *  2/2011
JP  2007-280814 A  10/2007
(Continued)

OTHER PUBLICATIONS

May 15, 2018 International Search Report issued in International Patent Application No. PCT/JP2018/009667.

*Primary Examiner* — Timothy J Thompson
*Assistant Examiner* — Michael F McAllister
(74) *Attorney, Agent, or Firm* — Oliff PLC

(57) ABSTRACT

An electromagnetic shield member includes an electrically conductive shield pipe, a braided member obtained by braiding metal strands into a tubular shape, and a first coupling member that is ring-shaped and arranged on the outer circumferential surface of a portion of the braided member that has been fitted around the shield pipe. The first coupling member is configured to couple the braided member to the shield pipe by constricting the braided member
(Continued)

circumferentially inward, and is made of a different type of metal from the braided member. Also, an insulating film is provided on the inner circumferential surface of the first coupling member.

6 Claims, 3 Drawing Sheets

(58) Field of Classification Search
USPC .................................................. 174/72 A
See application file for complete search history.

(56) References Cited

U.S. PATENT DOCUMENTS

| | | | | |
|---|---|---|---|---|
| 9,272,675 | B2* | 3/2016 | Toyama | ............... H05K 9/0018 |
| 9,558,866 | B2* | 1/2017 | Shiga | ....................... H02G 3/06 |
| 2006/0169170 | A1 | 8/2006 | Endoh | |
| 2007/0257161 | A1* | 11/2007 | Geppert | .................... F16L 3/12 |
| | | | | 248/74.3 |
| 2009/0308632 | A1* | 12/2009 | Watanabe | ................ H01B 7/20 |
| | | | | 174/106 R |
| 2011/0204192 | A1* | 8/2011 | Geppert | ................ F16L 3/1233 |
| | | | | 248/74.1 |
| 2012/0312595 | A1* | 12/2012 | Sawada | .................... B60K 1/04 |
| | | | | 174/72 A |
| 2015/0008032 | A1* | 1/2015 | Nakai | .................. H02G 3/0468 |
| | | | | 174/650 |
| 2015/0287497 | A1* | 10/2015 | Shiga | .................. H01B 7/2825 |
| | | | | 174/84 R |
| 2018/0064003 | A1 | 3/2018 | Suetani et al. | |

FOREIGN PATENT DOCUMENTS

| | | |
|---|---|---|
| JP | 2012-018889 A | 1/2012 |
| JP | 2016-181587 A | 10/2016 |

* cited by examiner

ELECTROMAGNETIC SHIELD MEMBER, AND WIRE HARNESS

The present invention relates to an electromagnetic shield member for use in a wire harness for a vehicle for example.

BACKGROUND

As shown in JP 2007-280814A for example, in a wire harness for installation in a vehicle, an electrical wire is covered by an electromagnetic shield member as a countermeasure for electromagnetic noise. The electromagnetic shield member includes an electrically conductive tubular member and a braided member that is obtained by braiding electrically conductive strands into a tubular shape. The end portions of the tubular member and the braided member are coupled together with use of a coupling member to constitute a continuous tubular body, and the electrical wire is inserted into the tubular body so as to be electromagnetically shielded. The coupling member constricts the outer circumferential side of the braided member that has been fitted around the end portion of the tubular member, and thus the braided member is clamped between the coupling member and the outer circumferential surface of the tubular member.

SUMMARY

In the above-described electromagnetic shield member, there has been a problem that if the braided member and the coupling member are made of different types of metal from each other, electrolytic corrosion (galvanic corrosion) will occur if water comes into contact with the coupling portion between the braided member and the coupling member.

The present disclosure was achieved in light of the foregoing problem, and an object of certain aspects of the present disclosure to provide an electromagnetic shield member and a wire harness that can suppress the occurrence of electrolytic corrosion between the braided member and the coupling member.

An electromagnetic shield member that solves the foregoing problem is an electromagnetic shield member including: an electrically conductive tubular member; a braided shield that is obtained by braiding metal strands into a tubular shape, and that is configured to be fitted around the tubular member; and a coupling that is ring-shaped and made of a different type of metal from the braided shield, and that is configured to be arranged on an outer circumferential surface of a portion of the braided shield that has been fitted around the tubular member, and to couple the braided member to the tubular member by constricting the braided member circumferentially inward, wherein an insulating film is provided on an inner circumferential surface of the coupling member.

According to this configuration, the insulating film is provided between the braided member and the main metal portion of the coupling member, thus making it possible to suppress dissimilar metal contact between the braided member and the coupling member, and as a result, it is possible to suppress the occurrence of electrolytic corrosion between the braided member and the coupling member.

In an aspect of the electromagnetic shield member, the insulating film is provided on all surfaces of the coupling member.

The insulating film is provided on all surfaces of the coupling member, thus making it possible to more effectively suppress the occurrence of electrolytic corrosion between the braided member and the coupling member.

A wire harness that solves the foregoing problem includes: the electromagnetic shield member according to any of the above configurations, and an electrical wire inserted into the electromagnetic shield member.

According to this configuration, it is possible to provide a wire harness that achieves an effect similar to any of the effects described above.

According to the electromagnetic shield member and the wire harness of certain disclosed embodiments, it is possible to suppress the occurrence of electrolytic corrosion between a braided member and a coupling member.

DRAWINGS

DETAILED DESCRIPTION

Figure 1:
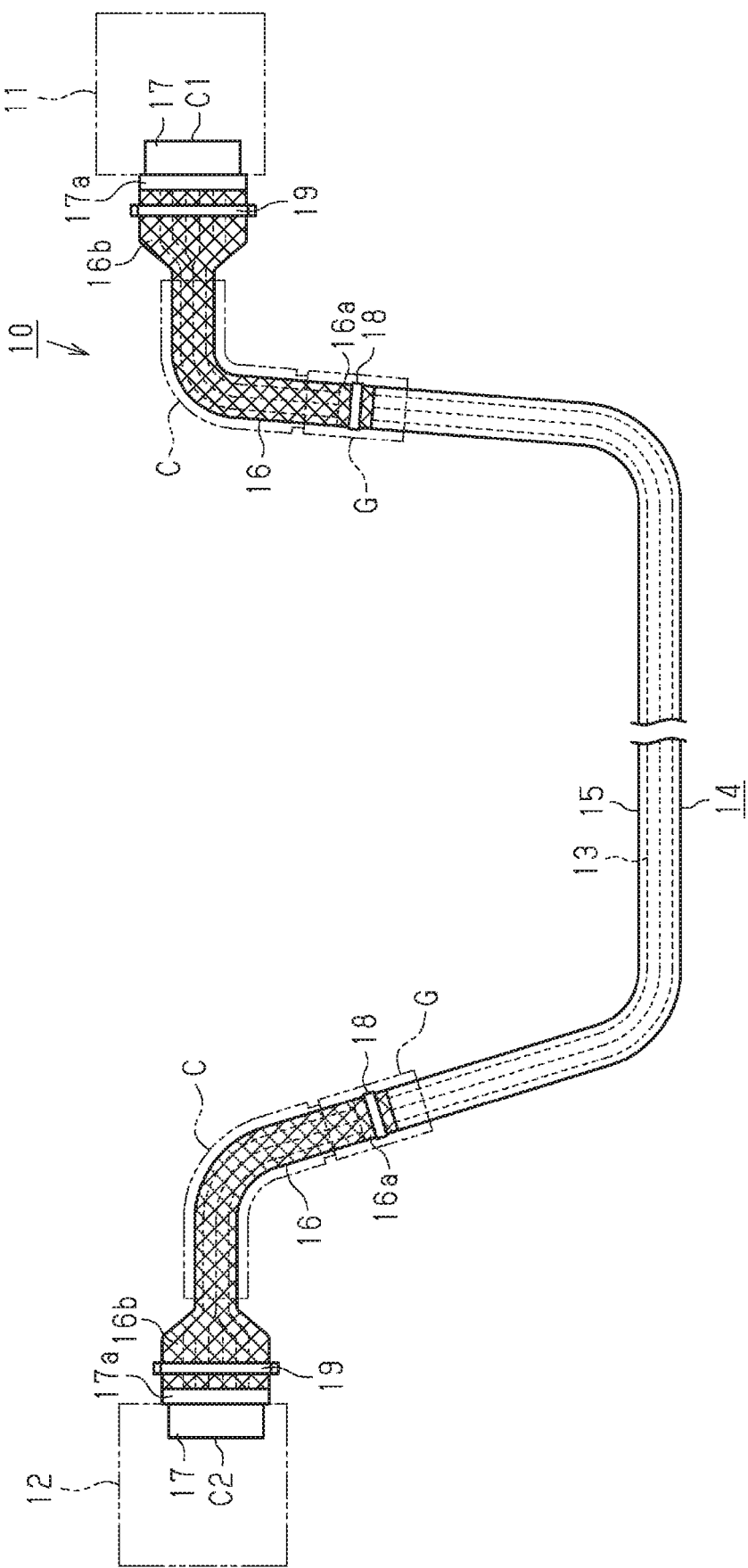
FIG. 1 is a schematic configuration diagram of a wire harness according to an embodiment.

The following describes an embodiment of an electromagnetic shield member and a wire harness. Note that for the sake of convenience in the description, portions of configurations are shown in an exaggerated or simplified manner in the drawings in some cases. The ratios of the dimensions of portions are also different from the actual ratios in some cases.

As shown in FIG. 1, a wire harness 10 of the present embodiment is routed in a vehicle such as a hybrid vehicle or an electric automobile so as to pass under the floor of the vehicle, for example, in order to connect a high-voltage battery 11 provided in a rear portion of the vehicle to an inverter 12 provided in a front portion of the vehicle, for example. The inverter 12 is connected to a wheel driving motor (not shown), which is a motive power source for vehicle traveling, generates alternating current power from direct current power received from the high-voltage battery 11, and supplies the alternating current power to the motor. The high-voltage battery 11 is a battery that is capable of supplying a voltage of several hundred volts.

The wire harness 10 includes an electrical wire bundle 13 that includes a high-voltage electrical wire, and an electromagnetic shield member 14 that covers the outer circumferential surface of the electrical wire bundle 13. One end portion of the electrical wire bundle 13 is connected to the high-voltage battery 11 via a connector C1, and another end portion is connected to the inverter 12 via a connector C2.

The electromagnetic shield member 14 includes a cylindrical shield pipe 15, tubular braided members 16 that are respectively coupled to two end portions of the shield pipe 15, and connector housings 17 (shells) for connectors C1 and C2 that are respectively coupled to end portions of the braided members 16 that are on the sides opposite to the shield pipe 15. The electromagnetic shield member 14 also includes first coupling members 18 that couple the shield pipe 15 to the braided members 16, and second coupling members 19 that couple the braided members 16 to the connector housings 17. The shield pipe 15, the braided members 16, and the connector housings 17 are coupled together with use of the first and second coupling members 18 and 19, thus being put into electrical conduction with each other and constituting a continuous tubular body. The shield pipe 15, the braided members 16, and the connector housing 17 are made of the same type of metal material (an aluminum-based metal material in the present embodiment).

The shield pipe 15 is to be routed so as to pass under the floor of the vehicle, and is bent into a predetermined shape that corresponds to the configuration of the region under the floor. The shield pipe 15 shields all of the electrical wire bundles 13 that have been inserted therein, and protects the electrical wire bundles 13 from flying rocks and the like.

The braided members 16 are each a tubular member obtained by braiding a plurality of metal strands (aluminum-based metal strands in the present embodiment), and are flexible. The braided members 16 surround and shield the portions of all of the electrical wire bundles 13 that extend out from the end portions of the shield pipe 15. Note that the braided members 16 are each surrounded by an external covering member C, which is a corrugated tube or the like. Also, at each of the connection locations between the shield pipe 15 and the braided members 16, a rubber grommet G is attached so as to surround the connection location and prevent the intrusion of water.

Figure 2:
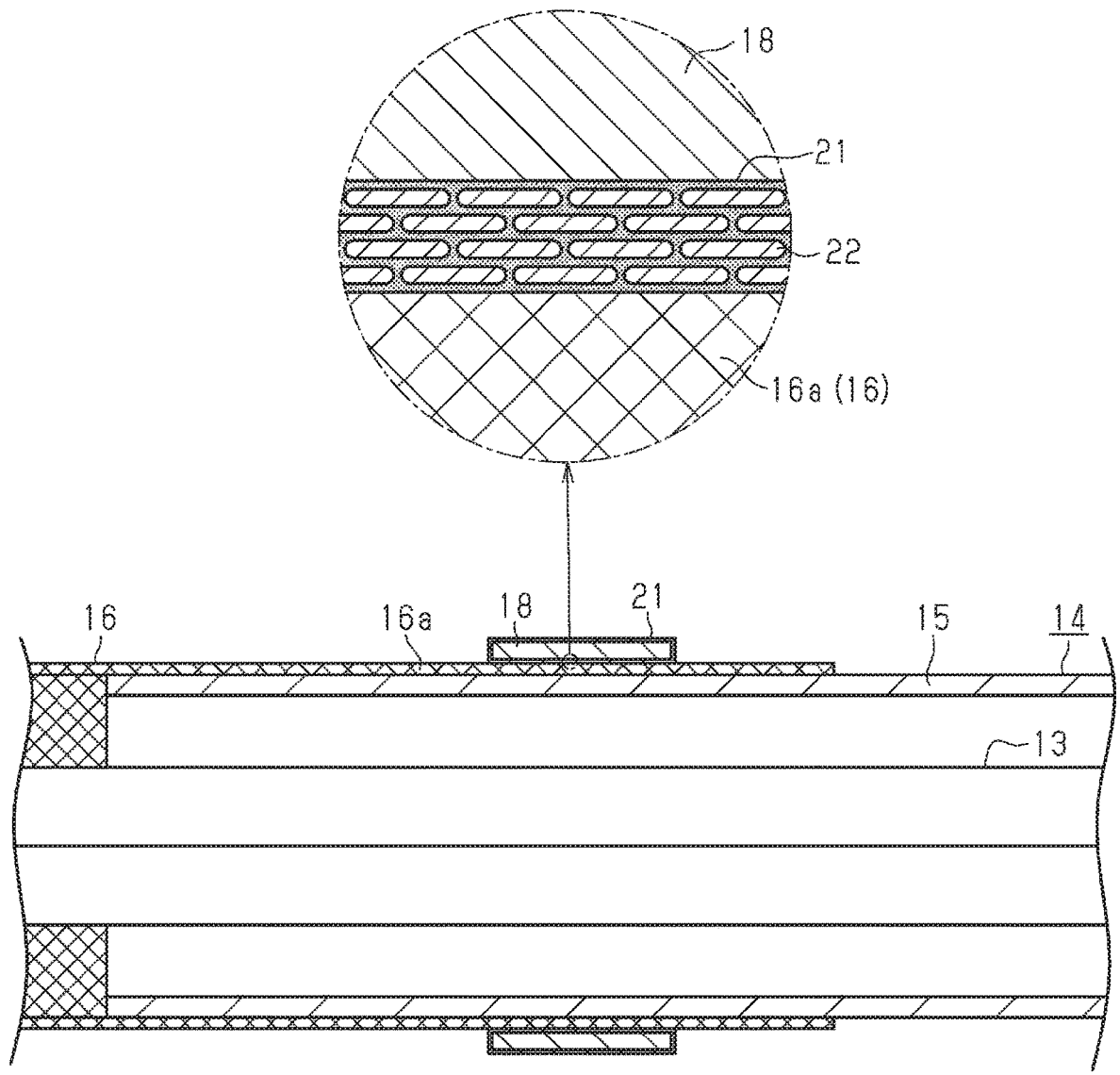
FIG. 2 is a cross-sectional view of a cross-section taken along an axial direction in a coupling portion of a shield pipe and a braided member according to the embodiment.
Figure 3:
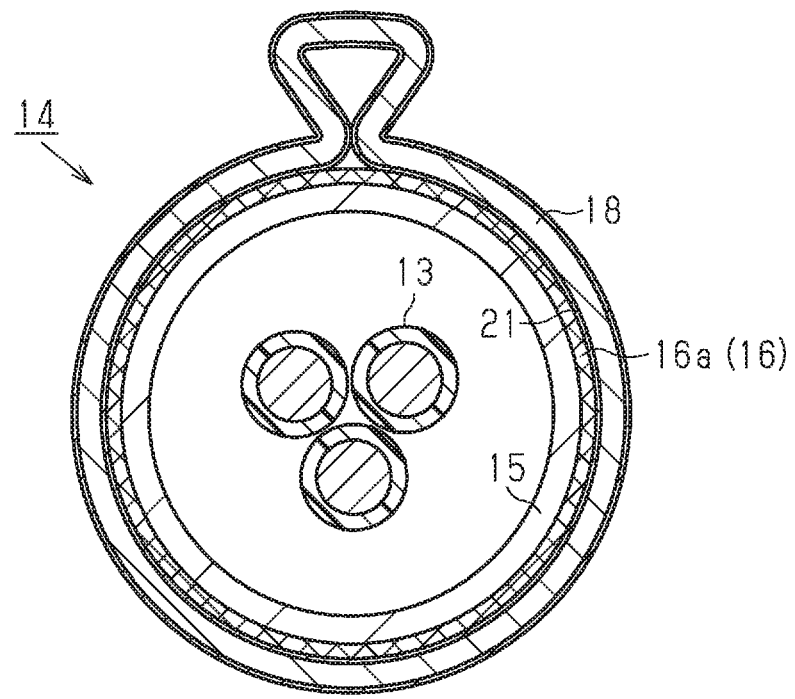
FIG. 3 is a cross-sectional view of a cross-section taken in a direction orthogonal to the axial direction in the coupling portion of the shield pipe and the braided member according to the embodiment.

As shown in FIGS. 2 and 3, one end portion of each of the braided members 16 is fitted around one end portion of the shield pipe 15, and the portion of the braided member 16 that is fitted around the shield pipe 15 (i.e., a fitted portion 16a) is shaped as a cylinder that conforms to the outer circumferential surface of the shield pipe 15, which has a circular cross-section. The fitted portion 16a of the braided member 16 is directly in contact with the outer circumferential surface of the shield pipe 15, and thus the shield pipe 15 and the braided member 16 are in electrical conduction with each other.

The first coupling member 18, which is shaped as a circular ring, is attached to the outer circumferential surface of the fitted portion 16a of the braided member 16. The first coupling member 18 of the present embodiment is a crimp ring that is made of stainless steel, and constricts the fitted portion 16a of the braided member 16 circumferentially inward such that the fitted portion 16a is clamped between the first coupling member 18 and the outer circumferential surface of the shield pipe 15. All surfaces of the first coupling member 18 have been subjected to surface processing for forming an insulating film 21. Specifically, the insulating film 21 covers the inner circumferential surface and the outer circumferential surface of the first coupling member 18, as well as the side surfaces on the two sides in the lengthwise direction of the electromagnetic shield member 14 (the lengthwise direction of the electrical wire bundle 13). The insulating film 21 of the present embodiment is made of a silicon-based material, and the silicon-based material contains minute thin metal pieces 22.

Figure 4:
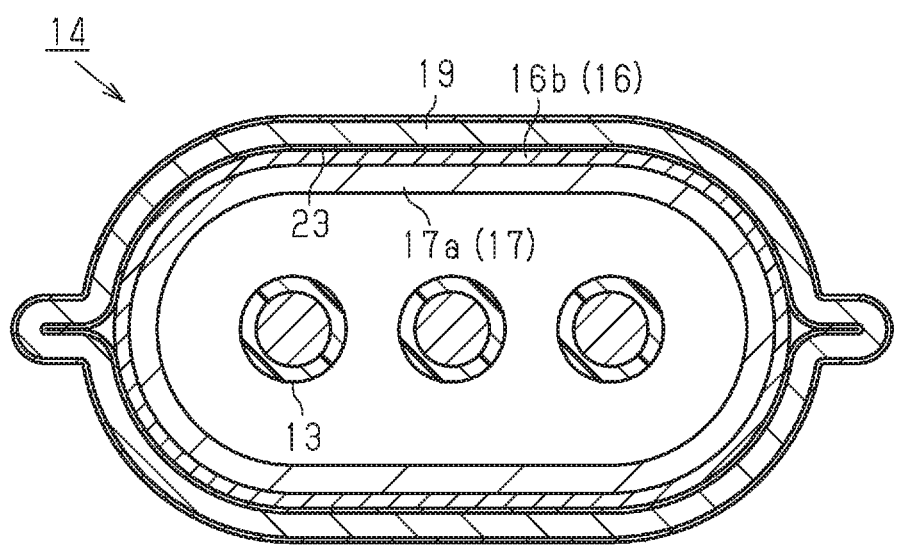
FIG. 4 is a cross-sectional view of a cross-section taken in a direction orthogonal to the axial direction in a coupling portion of a connector housing and the braided member according to the embodiment.

As shown in FIG. 4, the other end portion of each of the braided members 16 (the end portion on the side opposite to the shield pipe 15) is fitted around an elliptic cylinder portion 17a of one of the connector housings 17, and the portion of the braided member 16 that is fitted around the elliptic cylinder portion 17a (i.e., a fitted portion 16b) is shaped as an elliptic cylinder that conforms to the outer circumferential surface of the elliptic cylinder portion 17a. The fitted portion 16b of the braided member 16 is directly in contact with the outer circumferential surface of the elliptic cylinder portion 17a, and thus the elliptic cylinder portion 17a and the braided member 16 are in electrical conduction with each other.

The second coupling member 19, which is shaped as an elliptical ring, is attached to the outer circumferential surface of the fitted portion 16b of the braided member 16. Similarly to the first coupling member 18, the second coupling member 19 of the present embodiment is a crimp ring that is made of stainless steel, and constricts the fitted portion 16b of the braided member 16 circumferentially inward such that the fitted portion 16b is clamped between the second coupling member 19 and the outer circumferential surface of the elliptic cylinder portion 17a. Also, an insulating film 23 similar to the insulating film 21 of the first coupling member 18 is formed on all surfaces of the second coupling member 19.

The following describes operations of the present embodiment.

The insulating film 21 is provided between the inner circumferential surface of the first coupling member 18 (main stainless steel portion thereof) and the outer circumferential surface of the braided member 16. Accordingly, the first coupling member 18 and the braided member 16 are electrically insulated from each other, and as a result, the occurrence of electrolytic corrosion between the first coupling member 18 and the braided member 16 is suppressed. Also, in the first coupling member 18 of the present embodiment, the insulating film 21 is formed on not only the inner circumferential surface, but also the outer circumferential surface and the two side surfaces (the side surfaces on the two sides in the lengthwise direction of the electromagnetic shield member 14), thus making it possible to more effectively suppress the occurrence of electrolytic corrosion between the first coupling member 18 and the braided member 16. Note that the operations of the first coupling member 18 are similarly achieved by the second coupling member 19 as well.

The following describes effects of the present embodiment.

(1) The first coupling member 18 couples the braided member 16 to the shield pipe 15 by constricting the braided member 16 circumferentially inward, and is made of a different type of metal from the braided member 16. Also, the insulating film 21 is provided on the inner circumferential surface of the first coupling member 18. According to this configuration, the insulating film 21 is provided between the braided member 16 and the main metal portion (stainless steel) of the first coupling member 18, thus making it possible to suppress dissimilar metal contact between the braided member 16 and the first coupling member 18, and as a result, it is possible to suppress the occurrence of electrolytic corrosion between the braided member 16 and the first coupling member 18. Note that the insulating film 23 is similarly formed on the second coupling member 19 that couples the braided member 16 to the elliptic cylinder portion 17a of the connector housing 17, thus achieving effects similar to those described above.

(2) The insulating film 21 is provided on all surfaces of the first coupling member 18, thus making it possible to more effectively suppress the occurrence of electrolytic corrosion between the braided member 16 and the first coupling member 18. Specifically, it is possible to suppress the occurrence of electrolytic corrosion between the braided member 16 and the first coupling member 18 even if water were to completely cover the first coupling member 18.

Also, the insulating film 23 is similarly provided on all surfaces of the second coupling member 19 as well, thus achieving similar effects.

(3) The insulating films 21 and 23 contain the minute thin metal pieces 22, and therefore electrolytic corrosion of the braided member 16 can be suppressed even further by a sacrificial protection effect of the thin metal pieces 22. Note that if the braided member 16 is made of an aluminum-based metal material, it is preferable that the thin metal pieces 22 are made of a zinc-based metal material.

Note that changes such as the following may be made to the above embodiment.

Although the first and second coupling members 18 and 19 are crimp rings in the above embodiment, the present disclosed embodiments are not limited to this, and they may be hose clamps or the like.

Although the insulating films 21 and 23 are formed on all of the surfaces of the first and second coupling members 18 and 19 respectively, the present disclosed embodiments are not particularly limited to this, and a configuration is possible in which, for example, the insulating film 21 is formed on only the inner circumferential surface of the first coupling member 18, and the insulating film 23 is formed on only the inner circumferential surface of the second coupling member 19.

The constituent material of the insulating films 21 and 23 is not limited to a silicon-based material, and a material other than a silicon-based material may be used as long as it is a material that can achieve electrical insulation of the braided members 16 from the first and second coupling members 18 and 19.

The thin metal pieces 22 are not necessarily required to be contained in the insulating films 21 and 23, and the thin metal pieces 22 may be omitted from the insulating films 21 and 23.

The configurations of the insulating films 21 and 23 in the above embodiment are merely one example, and these configurations may be changed appropriately in accordance with the configurations of the first and second coupling members 18 and 19 and the braided member 16. For example, the insulating films may be made of a resin and be formed by cathodic electrodeposition, or may be insulating films formed by another method.

The materials forming the shield pipe 15, the braided members 16, the connector housings 17, and the first and second coupling members 18 and 19 are not limited to the materials in the above embodiment. For example, the shield pipe 15, the braided members 16, and the connector housings 17 may be formed from a material other than an aluminum-based metal material, as along as it is an electrically conductive material that achieves shielding.

Instead of the shield pipe 15 in the above embodiment, it is possible to use a shield pipe obtained by forming an electrically conductive shield layer on the outer circumferential surface of a pipe main body that is made of a non-metallic material (e.g., a resin material), or a shield pipe obtained by further forming a resin layer on the outer circumferential surface of the shield layer of the aforementioned shield pipe. Note that in the case of the latter shield pipe, the braided member 16 is connected to a portion of the shield layer that has been exposed by removing a portion of the outer resin layer.

A configuration is possible in which the shield pipe 15 is omitted from the electromagnetic shield member 14 of the above embodiment, and the portion that was covered by the shield pipe 15 is covered by the braided members 16.

The configuration of the electrical wires included in the electrical wire bundle 13 in the above embodiment may be changed as appropriate in accordance with the configuration of the vehicle. For example, the electrical wire bundle 13 may include a low-voltage electrical wire that is for connecting a low-voltage battery to various types of low-voltage devices (e.g., lamps and a car audio device). Also, the electrical wire bundle 13 may have a configuration not including the high-voltage electrical wire (e.g., may have a configuration including only the low-voltage electrical wire).

The positional relationship of the high-voltage battery 11 and the inverter 12 in the vehicle is not limited to the above embodiment, and may be changed as appropriate in accordance with the configuration of the vehicle. Also, although the high-voltage battery 11 is connected to the inverter 12 via the wire harness 10 in the above embodiment, the high-voltage battery 11 may be connected to a high-voltage device other than the inverter 12.

Although the present invention is applied to the wire harness 10 that connects the high-voltage battery 11 to the inverter 12 in the above embodiment, alternatively, the present invention may be applied to a wire harness that connects the inverter 12 to the wheel driving motor.

The above embodiment and variations may be combined as appropriate.

It will be apparent to those skilled in the art that the present invention may be embodied in other specific forms without departing from the technical concept of the invention. For example, the components described in the embodiment above (or one or more aspects thereof) may be partly omitted and/or combined. The scope of the present invention is to be defined with reference to the appended claims, along with the full range of equivalents to which the claims are entitled.

LIST OF REFERENCE NUMERALS

10 Wire harness
13 Electrical wire bundle
14 Electromagnetic shield member
15 Shield pipe (tubular member)
16 Braided member (braided shield)
17a Elliptic cylinder portion (tubular member)
18 First coupling
19 Second coupling
21, 23 Insulating film

The invention claimed is:

1. An electromagnetic shield member comprising:
an electrically conductive tubular member;
a braided shield including braiding metal strands in a tubular shape, and the braided shield being configured to be fitted around the tubular member;
a coupling that is ring-shaped and made of a different type of metal from the braided shield, the coupling being configured to be arranged on an outer circumferential surface of a portion of the braided shield that has been fitted around the tubular member, and configured to couple the braided member to the tubular member by constricting the braided shield circumferentially inward; and an insulating film provided on an inner circumferential surface of the coupling, the insulating film including thin metal pieces.

2. The electromagnetic shield member according to claim 1, wherein the insulating film is provided on all surfaces of the coupling.

3. The electromagnetic shield according to claim 1, wherein the insulating film is made of a silicon based material.

4. The electromagnetic shield member according to claim 1, wherein the thin metal pieces are made of a zinc-based metal material.

5. A wire harness comprising:
the electromagnetic shield member according to claim 4, and
an electrical wire inserted into the electromagnetic shield member.

6. The electromagnetic shield member according to claim 1, wherein the insulating film covers an entirety of an outer circumferential surface of the coupling.

* * * * *